(12) United States Patent
Zhu (10) Patent No.: US 12,144,135 B2
(45) Date of Patent: Nov. 12, 2024

(54) DISPLAY MODULE, DISPLAY DEVICE (71) Applicant: Wuhan China Star Optoelectronics Semiconductor Display Technology Co., Ltd., Wuhan (CN)

(72) Inventor: Cuilin Zhu, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 0 days.

(21) Appl. No.: 17/618,576

(22) PCT Filed: Nov. 12, 2021

(86) PCT No.: PCT/CN2021/130341
§ 371 (c)(1),
(2) Date: Dec. 13, 2021

(87) PCT Pub. No.: WO2023/077547
PCT Pub. Date: May 11, 2023

(65) Prior Publication Data
US 2024/0284620 A1    Aug. 22, 2024

(30) Foreign Application Priority Data

Nov. 5, 2021 (CN) .......................... 202111305354.3

(51) Int. Cl.
*H05K 5/02* (2006.01)
*H05K 1/18* (2006.01)
*H10K 59/131* (2023.01)
*H10K 102/00* (2023.01)

(52) U.S. Cl.
CPC ........... *H05K 5/0247* (2013.01); *H05K 1/189* (2013.01); *H10K 59/131* (2023.02); *H05K 2201/10128* (2013.01); *H10K 2102/311* (2023.02)

(58) Field of Classification Search
CPC ................. H05K 5/0247; H05K 1/189; H05K 2201/10128; H10K 59/131; H10K 2102/311
See application file for complete search history.

(56) References Cited

FOREIGN PATENT DOCUMENTS

CN          112864177 A    *    5/2021    ......... H01L 27/1214

OTHER PUBLICATIONS

Machine translation of CN-112864177-A (Year: 2021).*

* cited by examiner

*Primary Examiner* — Anne M Hines
*Assistant Examiner* — Jose M Diaz
(74) *Attorney, Agent, or Firm* — Nathan & Associates; Menachem Nathan (57) ABSTRACT

The application discloses a display module and a display device, comprising a flexible circuit board; the flexible circuit board includes a plurality of binding terminals and insulating parts; each of binding terminals includes a first sub-part and a second sub-part connected to each other, the flexible circuit board includes a first binding terminal and a second binding terminal, and the volume of the first sub-pare of the first binding terminal is larger than the volume of the first sub-part of the second binding terminal; and the insulating part includes a first insulating protrusion corresponding to the second binding terminal.

18 Claims, 5 Drawing Sheets

DISPLAY MODULE, DISPLAY DEVICE

FIELD OF INVENTION

The present application relates to the field of display technology, in particular to a display module and a display device having the display module.

BACKGROUND OF INVENTION

With the improvement of living standards, the flexible Organic Light-Emitting Diode (OLED) display devices are more and more popular among the public. Among them, Anisotropic Conductive Film (ACF), an anisotropic conductive adhesive, is a conductive adhesive used on a flexible display panel to bind the chip to the display panel, as a role of up and down conduction.

Usually, the pins on the display panel need to be bound with the binding terminals on the flexible circuit board through ACF adhesive to realize signal transmission. The flexible circuit board is also prepared with an insulating layer covering part of the bound terminals, and part of the bound terminals not covered by the insulating layer can be electrically connected to the pins. In the manufacturing process, the ACF adhesive is applied to the pins, and then the part of the flexible circuit board where the binding terminals are distributed is pressed together with the ACF adhesive and the pins; here, the ACF adhesive would cause a glue overflow, which will cover the bonding terminal and the insulating layer to prevent the bonding terminal from corroding in the subsequent manufacturing process.

However, since the display panel requires different types of signal inputs, the pin volumes or pin sizes corresponding to different signals are different. Since the flexible circuit board corresponds to pins of different sizes to form binding terminals of different volumes, in the ACF adhesive pressing process, there is less glue overflow on the smaller bound terminals, so the adhesive cannot cover the insulating layer with a small covered part, increasing the corrosion risk of the bound terminals.

Therefore, the embodiment of the application provides a display module and a display device to improve the coverage of the insulating part corresponding to the smaller bound terminal by the conductive adhesive, to reduce the corrosion risk of the bound terminal, and to improve the yield rate of the display module.

SUMMARY OF INVENTION

This application provides a display module which comprises a display panel, a flexible circuit board arranged on one side of the display panel, and a conductive adhesive arranged between the display panel and the flexible circuit board. The flexible circuit board further comprises a substrate, a first sub-area, a second sub-area and a plurality of binding terminals, and an insulating part. Wherein a plurality of binding terminals is arranged on the side of the substrate close to the conductive adhesive; wherein each of the binding terminals includes a first sub-part and a second sub-part connected to each other, the binding terminals includes a first binding terminal located in the first sub-area and a second binding terminal located in the second sub-area, and the volume of the first sub-part of the first binding terminal is greater than the volume of the first sub-part of the second binding terminal. Wherein the insulating part is arranged on the side of the substrate close to the conductive adhesive and is covering the second sub-part of each of the binding terminals. Wherein the conductive adhesive covers the first sub-part of each of the binding terminals and contacts with the insulating part. Wherein the insulating part includes an insulating body and a first insulating protrusion which is protruding from the insulating body toward the conductive adhesive, and the first insulating protrusion is located in the second sub-area.

In an embodiment of the present application, the display module further comprises a plurality of display function terminals arranged on the display panel, and the conductive adhesive is arranged on a side of the plurality of display function terminals away from the display panel, wherein each of the binding terminals electrically connects to each of the display function terminals through the conductive adhesive, wherein the conductive adhesive and the insulating part have an overlapping part in the thickness direction of the display panel.

In an embodiment of the present application, the conductive adhesive covers at least a surface of the first insulating protrusion on the side away from the second sub-part.

In an embodiment of the present application, the insulating body further includes a first insulating sub-part located in the first sub-area and a second insulating sub-part located in the second sub-area, and the first insulating protrusion connects to the second insulating sub-part. Wherein the conductive adhesive covers a part of the surface of the first insulating sub-part away from the second sub-part, or the conductive adhesive covers a part of the surface of the first insulating sub-part on the side away from the second sub-part and a part of the surface of the second insulating sub-part on the side away from the second sub-part, forming the overlapping part.

In an embodiment of the present application, the length of the first insulating protrusion along a first direction is greater than or equal to 50 μm and less than or equal to 100 μm, wherein the first direction is the direction in which the first insulating protrusion protrudes relative to the insulating body.

In an embodiment of the present application, the length of the overlapping part along the first direction is greater than or equal to 50 μm.

In an embodiment of the present application, the distance between the adjacent first binding terminal and the second binding terminal is greater than 60 μm.

In an embodiment of the present application, the flexible circuit board further includes a third sub-area, the binding terminals further include a third binding terminal located in the third sub-area, the volume of the first sub-part of the third binding terminal is smaller than the volume of the first sub-part of the second binding terminal, the insulating part further includes a second insulating protrusion which is protruding from the insulating body toward the direction of the conductive adhesive, and the second insulating protrusion is located in the third sub-area.

In an embodiment of the present application, the length of the second insulating protrusion along the first direction is greater than the length of the first insulating protrusion along the first direction, wherein the first direction is the direction in which the first insulating protrusion protrudes relative to the insulating body.

This application also provides a display device, comprising a display module and a device body, and the display module and the device body are combined into one object. The display module comprises a display panel, a flexible circuit board arranged on one side of the display panel, and conductive adhesive arranged between the display panel and the flexible circuit board. The flexible circuit board further comprises a substrate, a first sub-area, a second sub-area and a plurality of binding terminals, and an insulating part. Wherein a plurality of binding terminals is arranged on the side of the substrate close to the conductive adhesive; wherein each of the binding terminals includes a first sub-part and a second sub-part connected to each other, the binding terminals includes a first binding terminal located in the first sub-area and a second binding terminal located in the second sub-area, and the volume of the first sub-part of the first binding terminal is greater than the volume of the first sub-part of the second binding terminal. Wherein the insulating part is arranged on the side of the substrate close to the conductive adhesive and is covering the second sub-part of each of the binding terminals. Wherein the conductive adhesive covers the first sub-part of each of the binding terminals and contacts with the insulating part. Wherein the insulating part includes an insulating body and a first insulating protrusion which is protruding from the insulating body toward the conductive adhesive, and the first insulating protrusion is located in the second sub-area.

In an embodiment of the present application, the display module further comprises a plurality of display function terminals arranged on the display panel, and the conductive adhesive is arranged on a side of the plurality of display function terminals away from the display panel, wherein each of the binding terminals is electrically connected to each of the display function terminals through the conductive adhesive, wherein the conductive adhesive and the insulating part have an overlapping part in the thickness direction of the display panel.

In an embodiment of the present application, the conductive adhesive covers at least a surface of the first insulating protrusion on the side away from the second sub-part.

In an embodiment of the present application, the insulating body further includes a first insulating sub-part located in the first sub-area and a second insulating sub-part located in the second sub-area, wherein the first insulating protrusion connects to the second insulating sub-part. Wherein, the conductive adhesive covers a part of the surface of the first insulating sub-part away from the second sub-part, or the conductive adhesive covers a part of the surface of the first insulating sub-part on the side away from the second sub-part and a part of the surface of the second insulating sub-part on the side away from the second sub-part, so as to form the overlapping part.

In an embodiment of the present application, the length of the first insulating protrusion along a first direction is greater than or equal to 50 μm and less than or equal to 100 μm, wherein the first direction is the direction in which the first insulating protrusion protrudes relative to the insulating body.

In an embodiment of the present application, the length of the overlapping part along the first direction is greater than or equal to 50 μm.

In an embodiment of the present application, the distance between the adjacent first binding terminal and the second binding terminal is greater than 60 μm.

In an embodiment of the present application, the flexible circuit board further includes a third sub-area, the binding terminals further include a third binding terminal located in the third sub-area, the volume of the first sub-part of the third binding terminal is smaller than the volume of the first sub-part of the second binding terminal, the insulating part further includes a second insulating protrusion which is protruding from the insulating body toward the direction of the conductive adhesive, and the second insulating protrusion is located in the third sub-area.

In an embodiment of the present application, the length of the second insulating protrusion along the first direction is greater than the length of the first insulating protrusion along the first direction, wherein the first direction is the direction in which the first insulating protrusion protrudes relative to the insulating body.

Compared with the prior art, the present application provides a display module with a flexible circuit board. The flexible circuit board is provided with a first binding terminal and a second binding terminal, wherein the volume of the first binding terminal is greater than the volume of the second binding terminal. The flexible circuit board is also provided with an insulating part covering part of the first binding terminal and part of the second binding terminal. Since the first insulating protrusion is provided for the second binding terminal which has a smaller volume, the present invention has to increase the coverage of the second binding terminal by the insulating part. Moreover, during the manufacturing process, since the coverage of the second bonding terminal and the insulating layer by the conductive adhesive is increased, the present invention would reduce the risk of corrosion of the second bonding terminal and improve the bonding yield rate of the display module.

DESCRIPTION OF DRAWINGS

With the accompanying following drawings, through a detailed description of the specific implementations of the present application, the technical solutions and other beneficial effects of the present application will be apparent.

DETAILED DESCRIPTION OF EMBODIMENTS

The technical solutions in the embodiments of the present application will be clearly and completely described below in conjunction with the drawings in the embodiments of the present application. Obviously, the described embodiments are only a part of the embodiments of the present application, rather than all the embodiments, however, all other embodiments obtained by those skilled in the art based on the embodiments of this application without creative work shall fall within the protection scope of this application.

The following disclosure provides many different embodiments or examples for realizing different structures of the present application. To simplify the content of this application, the following describes the components and settings disclosed in this manual, which means, obviously, they are only examples, and are not intended to limit the application. In addition, the present application may repeat reference numerals and/or reference letters in different examples. Such repetition is for the purpose of simplification and clarity, and does not indicate the relationship between the various embodiments and/or settings discussed.

Moreover, this application provides examples of various specific processes and materials, but those of ordinary skill in the art may be aware of the application of other processes and/or the use of other materials.

Figure 1:
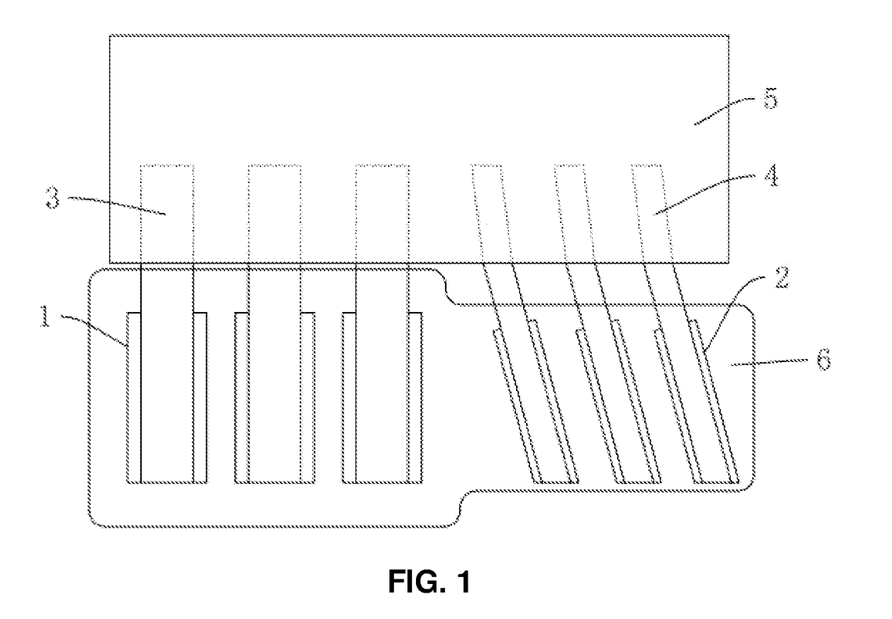
FIG. 1 is a schematic diagram of the binding structure of an existing display panel and a flexible circuit board.

Please refer to FIG. 1; currently, the flexible circuit board is often bound to the display panel to realize the input of electrical signals. Wherein, the flexible circuit board includes a plurality of metal terminals, and the display panel includes a plurality of pins that are connected to the metal terminals in one-to-one correspondence. The pins have different volumes corresponding to different signals; specifically, the pins include a first pin 1 and a second pin 2, wherein the volume of the first pin 1 is larger than the volume of the second pin 2. It should be noted that the embodiment of the present application proposes only but not limited two kinds of pins with different volume as an example for description. Correspondingly, the metal terminal includes a first metal terminal 3 corresponding to the first pin 1 and a second metal terminal 4 corresponding to the second pin 2, the flexible circuit board also includes an insulating layer 5 covering part of the metal terminal, and the uncovered part of the metal terminal can be connected to the pin. In the manufacturing process, the Anisotropic Conductive Film (ACF) conductive adhesive 6 can be coated on the pins, and then the part of the flexible circuit board with metal terminals can be pressed with the ACF conductive adhesive 6 to realize the binding connection between the pins and the metal terminals; Specifically, during the pressing process, the ACF conductive adhesive 6 will cause a glue overflow to further cover the metal terminals and the insulating layer, so as to realize the covering of the metal terminals for protection. However, due to the fluctuation of the manufacturing process, the overflow of adhesive may not be completely covered: since the volume ratio of the second metal terminal 4 is smaller than the volume ratio of the first metal terminal 3, during the pressing process, the amount of glue overflow generated at the second metal terminal 4 is smaller; therefore, it is more difficult for the ACF conductive adhesive 6 to cover the area corresponding to the second bonding terminal 4, increasing the risk of the second bonding terminal 4 being corroded in the subsequent manufacturing process and affecting the bonding yield of the display module.

Figure 2:
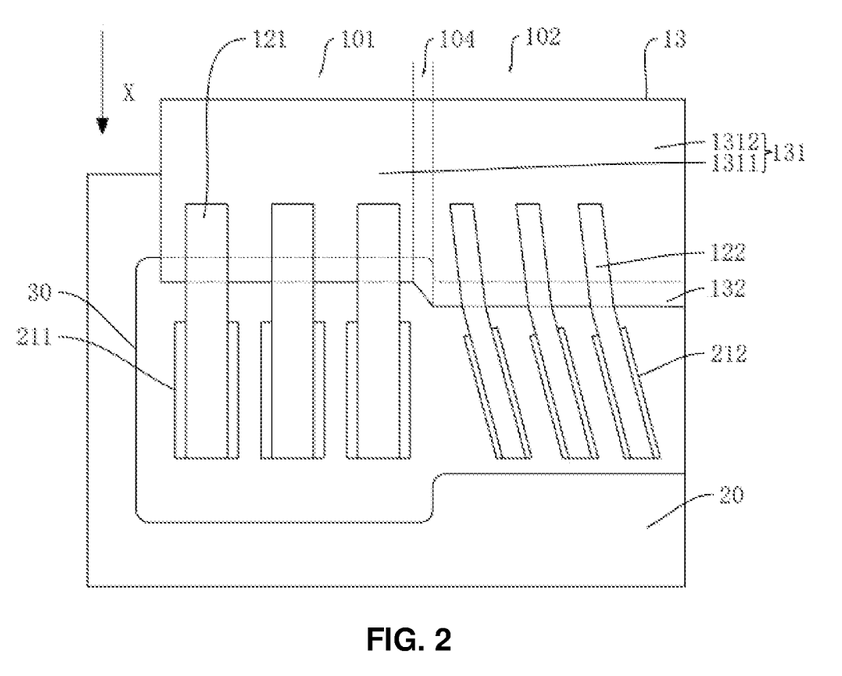
FIG. 2 is a schematic diagram of a binding structure of a display panel and a flexible circuit board provided by an embodiment of this application.
Figure 3:
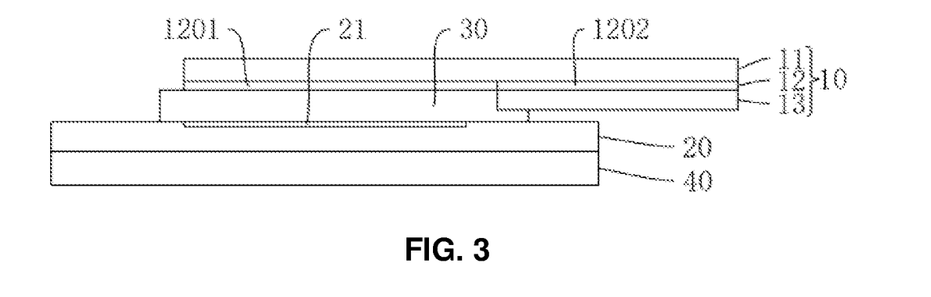
FIG. 3 is a cross-sectional view of the binding structure of the display panel and the flexible circuit board provided by an embodiment of the application.

In order to solve the above technical problems, an embodiment of the present application provides a display module; please refer to FIG. 2 and FIG. 3, the display module includes a display panel 20, a flexible circuit board 10 and a conductive adhesive 30. Wherein, the flexible circuit board 10 is disposed on one side of the display panel 20, and the conductive adhesive 30 is disposed between the flexible circuit board 10 and the display panel 20.

The flexible circuit board 10 includes a substrate 11, a plurality of binding terminals 12 arranged on one side of the substrate 11 close to the conductive adhesive 30, and an insulating part 13. Each of the binding terminals 12 includes a first sub-part 1201 and a second sub-part 1202, which are connect with each other; the insulating part 13 covers the second sub-part 1202 of each binding terminal 12; and the conductive adhesive 30 covers the first sub-part 1201 of each of binding terminals 12 and contacts with the insulating part 13.

The flexible circuit board 10 includes a first sub-area 101 and a second sub-area 102, and the binding terminals 12 include a first binding terminal 121 located in the first sub-area 101 and a second binding terminal 122 located in the second sub-area 102, wherein the volume of the first sub-part 1201 of the first binding terminal 121 is greater than the volume of the first sub-part 1201 of the second binding terminal 122.

Further, the insulating part 13 includes an insulating body 131 and a first insulating protrusion 132 protruding from the insulating body 131 toward the direction of the conductive adhesive 30, and the first insulating protrusion 132 is located in the second sub-area 102.

During the application process, the display module provided by the embodiment of the present application includes a flexible circuit board 10. The flexible circuit board 10 is provided with a first binding terminal 121 and a second binding terminal 122, and the volume of a first sub-part 1201 of the first binding terminal 121 is larger than the volume of a first sub-part 1201 of the second binding terminal 122. The flexible circuit board 10 is also provided with an insulating part 13 covering a part of the first binding terminal 121 and a part of the second binding terminal 122. Since the second binding terminal 122 with a smaller volume is provided with the first insulating protrusion 132, the embodiment of the present application increases the coverage of the insulating part 13 on the second binding terminal 122, so as to increase the coverage of the conductive adhesive 30 on the second binding terminal 122 and on the insulating part 13, to reduce the corrosion risk of the second binding terminal 122, and to improve the yield rate of the display module.

In the embodiment of the present application, please refer to FIG. 2 and FIG. 3, the display module includes a display panel 20, a flexible circuit board 10, a conductive adhesive 30, and a backplane 40; wherein the flexible circuit board 10 is arranged on one side of the display panel 20, the conductive adhesive 30 is arranged between the flexible circuit board 10 and the display panel 20, the flexible circuit board 10 is bound and connected to the display panel 20 by conductive adhesive 30, and the backplane 40 is arranged on the side of the display panel 20 facing away from the conductive adhesive 30.

Furthermore, a plurality of display function terminals 21 are provided on the display panel 20, and the conductive adhesive 30 is arranged on one side of the plurality of display function terminals 21 away from the display panel 20; the flexible circuit board 10 includes a plurality of binding terminals 12, which are arranged on one side of the conductive adhesive 30 away from the plurality of display function terminals 21; each of binding terminals 12 is bound and connected to each of display function terminals 21 through the conductive adhesive 30, achieving signal inputs.

Specifically, the flexible circuit board 10 includes a substrate 11, a plurality of binding terminals 12 provided on the substrate 11, and an insulating part 13; wherein, each of binding terminals 12 includes a first sub-part 1201 and a second sub-part 1202, the insulating part 13 covers the second sub-part 1202 of each of binding terminals 12, and the conductive adhesive 30 covers the second sub-part 1202 of each of binding terminals 12 on one side of surface away from the plurality of display function terminals 21 and connects with the insulating part 13; so that, the insulating part 13 and the conductive adhesive 30 completely cover each of binding terminals 12.

Since the signal input types of the display panel 20 are different, different display function terminals 21 are required for signal input; wherein, the plurality of display function terminals 21 include a first display function terminal 211 and a second display function terminal 212, and the volume of the first display function terminal 211 is greater than the volume of the second display function terminal 212; in the other hand, the plurality of binding terminals 12 includes a first binding terminal 121 correspondingly bound and connected to the first display function terminal 211 and a second binding terminal 122 correspondingly bound and connected to the second display function terminal 212, and the volume of the first binding terminal 121 is greater than the volume of the second binding terminal 122.

Optionally, the first display function terminal 211 can be used to transmit a test signal, for such as a lighting test, and the second display function terminal 212 can be used to transmit a normal display signal; but they both not are limited to that. Moreover, as shown in FIG. 2, the first display function terminals 211 may be arranged vertically, and the second display function terminals 212 may be arranged obliquely; corresponding, the first binding terminals 121 may be arranged vertically, and the second binding terminals 122 may be arranged obliquely.

It should be noted that the flexible circuit board 10 includes a first sub-area 101 and a second sub-area 102; correspondingly, the first bonding terminal 121 is located in the first sub-area 101, and the second bonding terminal 122 is located in the second sub-area 102. In the embodiments of this application, an insulating part 13 includes an insulating body 131 and a first insulating protrusion 132 protruding from the insulating body 131 toward the direction of the conductive adhesive 30; in addition, the first insulating protrusion 132 is located in the second sub-area 102 and covers the second sub-part 1202 of the second binding terminal 122 correspondingly.

To sum up, in the manufacturing process of the display module, during the pressing process of the flexible circuit board 10 and the display panel 20, since the volume of the second binding terminal 122 is smaller than the volume of the first binding terminal 121, the amount of glue overflow of the conductive adhesive 30 of the second binding terminal 122 will be smaller than the amount of glue overflow of the conductive adhesive 30 of the first binding terminal 121; hence, the coverage of the second binding terminal 122 by the conductive adhesive 30 is less than the coverage of the first binding terminal 121 by the conductive adhesive 30. Therefore, since the first insulating protrusion 132 is provided with the smaller second binding terminal 122, the embodiment of the present invention increases the coverage of by the insulating part 13 on the second binding terminal 122, so as to increase the coverage of the insulating part 13 and the conductive adhesive 30 on the second bonding terminal 122, to reduce the corroded risk of the second bonding terminal 122 due to exposure, and to improve bonding yield rate between the flexible circuit board 10 and the display panel 20.

Furthermore, the conductive adhesive 30 and the insulating part 13 have an overlapping part in the thickness direction of the display module, that is, the conductive adhesive 30 covers the first sub-part 1201 of each binding terminal 12 and the side of the insulating part 13 close to the conductive adhesive 30.

Optionally, the length of the overlapping part along the first direction X is greater than or equal to 50 μm; wherein the first direction X is the direction in which the first insulating protrusion 132 protrudes relative to the insulating body 131.

Specifically, please refer to FIG. 2, in an embodiment of the present application, the insulating body 131 includes a first insulating sub-part 1311 located in the first sub-area 101 and a second insulating sub-part 1312 located in the second sub-area 102; that is, the first insulating sub-part 1311 correspondingly covers the first sub-area 1201 of the first binding terminal 121, and the second insulating sub-part 1312 correspondingly covers the first sub-part 1201 of the second binding terminal 122.

To improve the protection of the second binding terminal 122, the conductive adhesive 30 covers the first insulating protrusion 132, that is the conductive adhesive 30 covers a part of the surface of the first insulating protrusion 132 away from the second sub-part 1202; the conductive adhesive 30 and the insulating part 13 jointly cover the second binding terminal 122; and the conductive adhesive 30 covers a part of the first insulating protrusion 132.

At the same time, to improve the protection of the first binding terminal 121, the conductive adhesive 30 also covers the side of the first insulating sub-part 1311 close to the conductive adhesive 30, that is, the conductive adhesive 30 covers a part of the surface of the first insulating sub-part 1311 away from the second sub-part 1202; the conductive adhesive 30 and the insulating part 13 jointly cover the first binding terminal 121; and the conductive adhesive 30 also covers part of the first insulating sub-part 1311.

Optionally, the length of the first insulating protrusion 132 along the first direction X is greater than or equal to 50 μm and less than or equal to 100 μm.

In this embodiment, the conductive adhesive 30 covers the first sub-part 1201 of each of binding terminals 12, the side of the insulating part 13 close to the conductive adhesive 30, the first insulating protrusion 132, and a part of the first insulating sub-part 1311, so that each of the bonding terminals 12, especially for the second bonding terminal 122 with a smaller volume, is completely covered, so as to avoid corrosion and to improve the bonding yield of the flexible circuit board 10 and the display panel 20.

In addition, in the embodiment of the present application, the distance between the adjacent first binding terminal 121 and the second binding terminal 122 is greater than 60 μm.

Specifically, please continue to refer to FIG. 2, the flexible circuit board 10 further includes a transition area 104 located between the first sub-area 101 and the second sub-area 102; if there is a slope, not limited to a straight slope or curved slope, at the connection between the first insulating protrusion 132 and the insulating sub-part 1311, the transition area 104 can be formed.

Wherein, the shortest distance between the transition area 104 and the first bonding terminal 121 closest to the transition area 104 is greater than 30 μm, and the shortest distance between the transition area 104 and the second bonding terminal 122 closest to the transition area 104 is greater than 30 μm.

It should be noted that, in other embodiments of this application, the first insulating protrusion 132 and the first insulating sub-part 1311 are connected as a vertical connection without a slope, so no transition area 104 here; then the shortest distance between the boundary of the first sub-area 101 and the second sub-area 102 from the first binding terminal 121 is greater than 30 μm; the shortest distance between the boundary of the first sub-area 101 and the second sub-area 102 from the second bonding terminal 122 is also greater than 30 μm.

Figure 4:
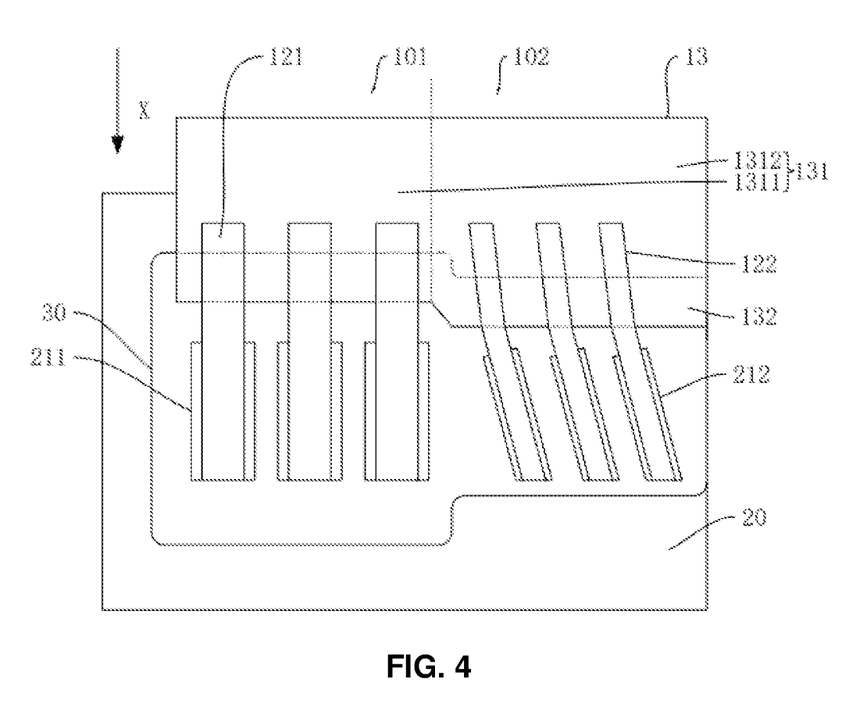
FIG. 4 is a schematic diagram of another binding structure of a display panel and a flexible circuit board provided by an embodiment of this application.

Please refer to FIG. 3 and FIG. 4, in another embodiment of the present application, the insulating body 131 includes a first insulating sub-part 1311 located in the first sub-area 101 and a second insulating sub-part 1312 located in the second sub-area 102; the first insulating sub-part 1311 correspondingly covers to the first sub-part 1201 of the first binding terminal 121, the second insulating sub-part 1312 correspondingly covers the first sub-part 1201 of the second binding terminal 122, and the first insulating protrusion 132 is connected to the second insulating sub-part 1312.

The conductive adhesive 30 covers the first insulating protrusion 132, the side of the second insulating sub-part 1312 close to the conductive adhesive 30, a part of the surface of the first insulating protrusion 132 on the side away from the second sub-part 1202, a part of the surface of the second insulating sub-part 1312 on the side away from the second sub-part 1202, the first insulating protrusion 132, and a part of the second insulating sub-part 1312; also, the conductive adhesive 30 and the insulating part 13 jointly cover the second binding terminal 122, so as to improve the protection of the second binding terminal 122, At the same time, the conductive adhesive 30 also covers the side of the first insulating sub-part 1311 close to the conductive adhesive 30, a part of the surface of the first insulating sub-part 1311 away from the second part, and a part of the first insulating sub-part 1311; also, the conductive adhesive 30 and the insulating part 13 jointly cover the first binding terminal 121, so as to improve the protection of the first binding terminal 121.

Therefore, in this embodiment, relative to the previous embodiment, the conductive adhesive 30 has a larger coverage area, which includes: the surface of the first insulating protrusion 132 away from the surface of the second sub-part 1202, a part of the surface of the second insulating sub-part 1312 away from the second sub-part 1202, and a part of the surface of the first insulating sub-part 1311 away from the second sub-part 1202. Hence, in this embodiment, the conductive adhesive 30 and the insulating part 13 cover a greater area of each of binding terminals 12 to prevent the binding terminal 12, especially the second binding terminal 122, from being corroded more effectively.

Figure 5:
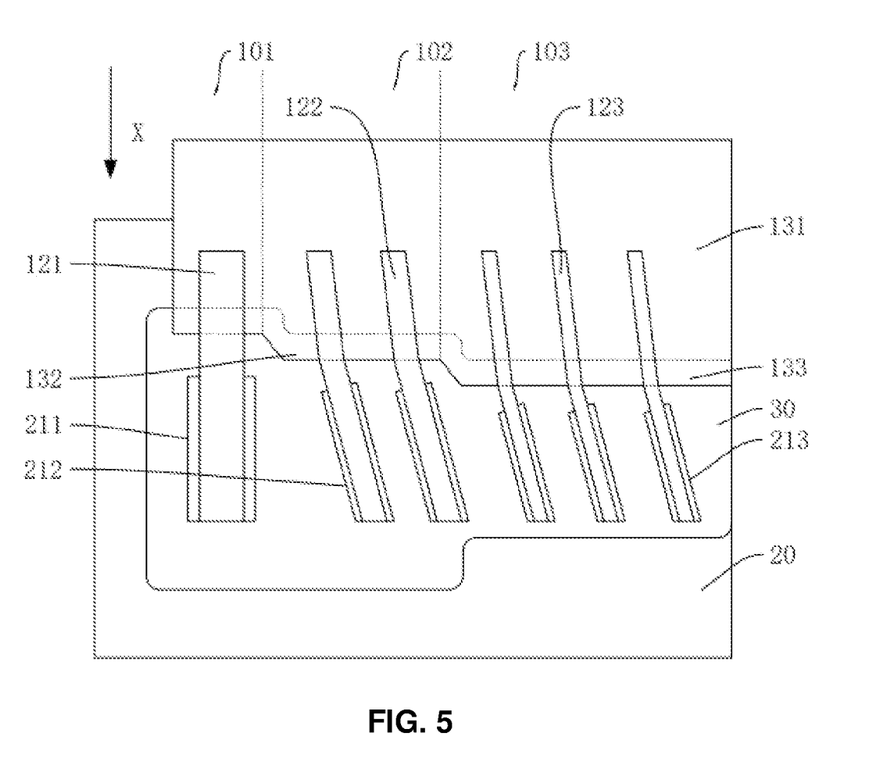
FIG. 5 is a schematic diagram of another binding structure of a display panel and a flexible circuit board provided by an embodiment of the application.

Please refer to FIG. 3 and FIG. 5, in another embodiment of the present application, the plurality of display function terminals 21 include a first display function terminal 211, a second display function terminal 212, and a third display function terminal 213. The volume of the first display function terminal 211 is larger than the volume of the second display function terminal 212, and the volume of the second display function terminal 212 is larger than the volume of the third display function terminal 213.

The flexible circuit board 10 includes a first sub-area 101, a second sub-area 102 and a third sub-area 103. The multiple binding terminals 12 include the first binding terminal 121 located in the first sub-area 101, the second binding terminal 122 located in the second sub-area 102, and the third binding terminal 123 located in the third sub-area 103. Wherein, the first binding terminal 121 and the first display function terminal 211 are correspondingly bound and connected, the second binding terminal 122 and the second display function terminal 212 are correspondingly bound and connected, and the third binding terminal 123 and the third display function terminal 213 are correspondingly bound and connected. Corresponding, the volume of the first binding terminal 121 is greater than the volume of the second binding terminal 122, and the volume of the second binding terminal 122 is greater than the volume of the third binding terminal 123; also, the volume of the first sub-part 1201 of the first binding terminal 121 is greater than the volume of the first sub-part 1201 of the second binding terminal 122, and the volume of the first sub-part 1201 of the second binding terminal 122 is greater than the volume of the first sub-part 1201 of the third binding terminal 123. In the process, the amount of glue overflow of the conductive adhesive 30 on the first binding terminal 121 is greater than the amount of glue overflow on the second binding terminal 122, and the amount of glue overflow of the conductive adhesive 30 on the second binding terminal 122 is greater than the amount of glue overflow on the third binding terminal 123.

In this embodiment, to improve the coverage of the conductive adhesive 30 and the insulating part 13 on each of binding terminals 12, a first insulating protrusion 132 and a second insulating protrusion 133 could be formed on the insulating part 13 protruding in the direction of the conductive adhesive 30 relative to the insulating body 131. Wherein, the first insulating protrusion 132 is located in the second sub-area 102 and correspondingly covers the second sub-part 1202 of the second binding terminal 122, and the second insulating protrusion 133 is located in the third sub-area 103 and correspondingly covers the second sub-part 1202 of the third binding terminal 123.

Furthermore, since the volume of the second sub-part 1202 of the second binding terminal 122 is greater than the volume of the second sub-part 1202 of the third binding terminal 123, and the length of the first insulating protrusion 132 in the first direction X is greater than the distance of the second insulating protrusion 133 in the first direction X, the amount of glue overflow of the conductive adhesive 30 on each of binding terminals 12, especially the amount of glue overflow on the second binding terminal 122 and on the third binding terminal 123, can be guaranteed; moreover, the insulating part 13 can be combined to cover each of binding terminals 12, so as to improve the binding yield of the flexible circuit board 10 and the display panel 20.

It should be noted that, in this embodiment, the conductive adhesive 30 covers at least the first insulating protrusion 132, the second insulating protrusion 133 and the part of the insulating body 131 located in the first sub-area 101, so as to further improve the coverage of each of binding terminals 12 and to reduce the corrosion risk of each of binding terminals 12, especially the second binding terminal 122 and the third binding terminal 123.

In summary, the display module provided by the embodiment of the present application includes a flexible circuit board 10, which is provided with a first binding terminal 121 and a second binding terminal 122; wherein, the volume of the first sub-part 1201 of the first binding terminal 121 is greater than the volume of the first sub-part 1201 of the second binding terminal 122; also, the flexible circuit board 10 is provided with an insulating part 13 covering a part of the first binding terminal 121 and a part of the second binding terminal 122. Thus, in this application, the second binding terminal 122 with a relatively small volume is provided with a first insulating protrusion 132 to increase the coverage of the insulating part 13 on the second binding terminal 122, to improve the coverage of the conductive adhesive 30 on the second binding terminal 122 and on the insulating part 13 during the manufacturing process, so as to reduce the corrosion risk of the second binding terminal 122 and improve the yield rate of the display module.

In addition, an embodiment of the present application also provides a display device, which includes a device body and the display module described in the above-mentioned embodiment; since the structure of the display module is the same as that described in the above embodiment so will not be repeated here. The display device and the display module are combined into one body.

The display device provided by the embodiment of the present application may include wearable devices, such as smart bracelets, smart watches, and virtual reality (Virtual Reality, VR), mobile phones, e-books, e-newspapers, televisions, personal laptops, foldable and rollable OLEDs and other flexible display and lighting equipment.

In the above-mentioned embodiments, the description of each embodiment has its own emphasis. For parts that are not described in detail in an embodiment, a reference may be made to related descriptions of other embodiments.

The above is a detailed introduction to a display module and a display device provided by the embodiments of the present application. Specific examples are used in this article to explain the principles and implementations of the present application. The description of the above embodiments is only used to help understand the present application. The applied technical solution and its core ideas; Those of ordinary skill in the art should understand that: they can still modify the technical solutions described in the foregoing embodiments, or equivalently replace some of the technical features; however, these modifications or replacements do not cause the essence of the corresponding technical solutions to deviate from the scope of the technical solutions of the embodiments of the present application.

What is claimed is:

1. A display module, comprising a display panel, a flexible circuit board arranged on one side of the display panel, and a conductive adhesive arranged between the display panel and the flexible circuit board; wherein
the flexible circuit board further comprising:
a substrate;
a first sub-area and a second sub-area;
a plurality of binding terminals, arranged on the side of the substrate close to the conductive adhesive, wherein each of the binding terminals includes a first sub-part and a second sub-part connected to each other, the binding terminals includes a first binding terminal located in the first sub-area and a second binding terminal located in the second sub-area, and the volume of the first sub-part of the first binding terminal is greater than the volume of the first sub-part of the second binding terminal;
an insulating part, arranged on the side of the substrate close to the conductive adhesive and covering the second sub-part of each of the binding terminals, wherein the conductive adhesive covers the first sub-part of each of the binding terminals and contacts with the insulating part; and
wherein the insulating part includes an insulating body and a first insulating protrusion which is protruding from the insulating body toward the conductive adhesive, and the first insulating protrusion is located in the second sub-area.

2. The display module according to claim 1, wherein the display module further comprises a plurality of display function terminals arranged on the display panel, and the conductive adhesive is arranged on one side of the plurality of display function terminals away from the display panel, wherein each of the binding terminals electrically connects to each of the display function terminals through the conductive adhesive, wherein the conductive adhesive and the insulating part have an overlapping part in the thickness direction of the display panel.

3. The display module according to claim 2, wherein the conductive adhesive covers at least one surface of the first insulating protrusion on the side away from the second sub-part.

4. The display module according to claim 3, wherein the insulating body further includes a first insulating sub-part located in the first sub-area and a second insulating sub-part located in the second sub-area, and the first insulating protrusion connects to the second insulating sub-part; wherein, the conductive adhesive covers a part of the surface of the first insulating sub-part away from the second sub-part, or the conductive adhesive covers a part of the surface of the first insulating sub-part on the side away from the second sub-part and a part of the surface of the second insulating sub-part on the side away from the second sub-part, forming the overlapping part.

5. The display module according to claim 4, wherein the length of the first insulating protrusion along a first direction is greater than or equal to 50 μm and less than or equal to 100 μm, wherein the first direction is the direction in which the first insulating protrusion protrudes relative to the insulating body.

6. The display module according to claim 5, wherein the length of the overlapping part along the first direction is greater than or equal to 50 μm.

7. The display module according to claim 1, wherein the distance between the adjacent first binding terminal and the second binding terminal is greater than 60 μm.

8. The display module according to claim 1, wherein the flexible circuit board further includes a third sub-area, the binding terminals further include a third binding terminal located in the third sub-area, the volume of the first sub-part of the third binding terminal is smaller than the volume of the first sub-part of the second binding terminal, the insulating part further includes a second insulating protrusion which is protruding from the insulating body toward the direction of the conductive adhesive, and the second insulating protrusion is located in the third sub-area.

9. The display module according to claim 8, wherein the length of the second insulating protrusion along the first direction is greater than the length of the first insulating protrusion along the first direction, wherein the first direction is the direction in which the first insulating protrusion protrudes relative to the insulating body.

10. A display device, comprising a display module and a device body, and the display module and the device body are combined into one object; the display module, comprising a display panel, a flexible circuit board arranged on one side of the display panel, and a conductive adhesive arranged between the display panel and the flexible circuit board; wherein
the flexible circuit board further comprising:
a substrate;
a first sub-area and a second sub-area;
a plurality of binding terminals, arranged on the side of the substrate close to the conductive adhesive, wherein each of the binding terminals includes a first sub-part and a second sub-part connected to each other, wherein the binding terminals includes a first binding terminal located in the first sub-area and a second binding terminal located in the second sub-area, and the volume of the first sub-part of the first binding terminal is greater than the volume of the first sub-part of the second binding terminal;
an insulating part, arranged on the side of the substrate close to the conductive adhesive and covering the second sub-part of each of the binding terminals, wherein the conductive adhesive covers the first sub-part of each of the binding terminals and contacts with the insulating part; and
wherein the insulating part includes an insulating body and a first insulating protrusion which is protruding from the insulating body toward the conductive adhesive, and the first insulating protrusion is located in the second sub-area.

11. The display device according to claim 10, wherein the display module further comprises a plurality of display function terminals arranged on the display panel, and the conductive adhesive is arranged on one side of the plurality of display function terminals away from the display panel, wherein each of the binding terminals is electrically connected to each of the display function terminals through the conductive adhesive, wherein the conductive adhesive and the insulating part have an overlapping part in the thickness direction of the display panel.

12. The display device according to claim 11, wherein the conductive adhesive covers at least a surface of the first insulating protrusion on the side away from the second sub-part.

13. The display device according to claim 12, wherein the insulating body further includes a first insulating sub-part located in the first sub-area and a second insulating sub-part located in the second sub-area, wherein the first insulating protrusion connects to the second insulating sub-part;

wherein, the conductive adhesive covers a part of the surface of the first insulating sub-part away from the second sub-part, or the conductive adhesive covers a part of the surface of the first insulating sub-part on the side away from the second sub-part and a part of the surface of the second insulating sub-part on the side away from the second sub-part, so as to form the overlapping part.

14. The display device according to claim 13, wherein the length of the first insulating protrusion along a first direction is greater than or equal to 50 μm and less than or equal to 100 μm, wherein the first direction is the direction in which the first insulating protrusion protrudes relative to the insulating body.

15. The display device according to claim 14, wherein the length of the overlapping part along the first direction is greater than or equal to 50 μm.

16. The display device according to claim 10, wherein the distance between the adjacent first binding terminal and the second binding terminal is greater than 60 μm.

17. The display device according to claim 10, wherein the flexible circuit board further includes a third sub-area, the binding terminals further include a third binding terminal located in the third sub-area, the volume of the first sub-part of the third binding terminal is smaller than the volume of the first sub-part of the second binding terminal, the insulating part further includes a second insulating protrusion which is protruding from the insulating body toward the direction of the conductive adhesive, and the second insulating protrusion is located in the third sub-area.

18. The display device according to claim 17, wherein the length of the second insulating protrusion along the first direction is greater than the length of the first insulating protrusion along the first direction, wherein the first direction is the direction in which the first insulating protrusion protrudes relative to the insulating body.

* * * * *